United States Patent [19]
Frankeny et al.

[11] Patent Number: 5,815,107
[45] Date of Patent: Sep. 29, 1998

[54] CURRENT SOURCE REFERENCED HIGH SPEED ANALOG TO DIGITIAL CONVERTER

[75] Inventors: Richard Francis Frankeny, Elgin; Mithkal Moh'd Smadi, Round Rock, both of Tex.

[73] Assignee: International Business Machines Corporation, Armonk, N.Y.

[21] Appl. No.: 770,603

[22] Filed: Dec. 19, 1996

[51] Int. Cl.$^6$ .............................. H03M 1/36; H03M 1/42
[52] U.S. Cl. ........................................... 341/159; 341/155
[58] Field of Search .................................... 341/159, 155, 341/158, 170, 136

[56] References Cited

U.S. PATENT DOCUMENTS

| | | |
|---|---|---|
| 4,275,386 | 6/1981 | Michel et al. ........................... 341/159 |
| 4,453,121 | 6/1984 | Noufer . |
| 4,604,740 | 8/1986 | Gandini et al. . |
| 4,614,882 | 9/1986 | Parker et al. . |
| 4,634,894 | 1/1987 | Shu et al. . |
| 4,638,473 | 1/1987 | Cooperman et al. . |
| 4,698,800 | 10/1987 | Cavaliere et al. . |
| 4,703,198 | 10/1987 | Porter et al. . |
| 4,713,827 | 12/1987 | Lauffer et al. . |
| 4,736,293 | 4/1988 | Patrick . |
| 4,756,006 | 7/1988 | Rickard . |
| 4,859,877 | 8/1989 | Cooperman et al. . |
| 4,890,010 | 12/1989 | Neudeck et al. . |
| 4,975,599 | 12/1990 | Petrovick, Jr. et al. . |
| 5,004,986 | 4/1991 | Bohrer . |
| 5,030,855 | 7/1991 | Leung . |
| 5,095,231 | 3/1992 | Sortori et al. . |
| 5,105,295 | 4/1992 | O'Byrne . |
| 5,107,230 | 4/1992 | King . |
| 5,111,080 | 5/1992 | Mizukami et al. . |
| 5,134,311 | 7/1992 | Biber et al. . |

(List continued on next page.)

FOREIGN PATENT DOCUMENTS 504063  9/1919  France .

OTHER PUBLICATIONS

IBM TDB "Split Cache with Variable Interleave Boundary", vol. 22, No. 11, Apr. 1980, pp. 5183–5186.

IBM TDB "Improved Cost, Performance, and Reliability by Simutaneous Accesses to Pipelined Caches with Duplicate Data Protection and Enhanced Multiprocessor Performance", vol. 33, No. 1A, Jun. 1990, pp. 264–265.

IBM TDB "Simultaneous Bidirectional Baseband Data Transmission", vol. 11, No. 7, Dec. 1968, pp. 762–763.

IBM TDB "Bidirectional Communications within a Binary Switching System", vol. 18, No. 9, Feb. 1976, pp. 2865–2866.

IBM TDB "Componet Mismatch Accomodation for Bidirectional Chip to Chip Communication", vol. 22, No. 11, Apr. 1980, pp. 5029–5031.

IBM TDB "Simultaneous Bidirectional Transceiver Circuit", vol. 23, No. 4, Sep. 1980, pp. 1435–1437.

(List continued on next page.)

Primary Examiner—Howard L. Williams
Assistant Examiner—Peguy JeanPierre
Attorney, Agent, or Firm—Casimer K. Salys

[57] ABSTRACT

An architecture for a high speed analog current to digital voltage converter particularly suited for integrated circuit applications. As preferably implemented, an analog signal of current form and an associated reference current are generated on a source integrated chip. The reference current line and one or more analog current lines transmit data between the source and a receiving integrated circuit chips. The high speed converter utilizes current mirrors to simultaneously evaluate the analog inputs and determine the digital equivalents through current comparisons using currents derived from the reference current. The architecture provides for switching of current sources in lower order bits responsive to the detection of input currents enabling higher order bits. Since switching of lower order bits by higher order bits is accomplished simultaneously, the analog current to digital voltage conversion is accomplished within one switch period while retaining the relatively high accuracy.

10 Claims, 6 Drawing Sheets

U.S. PATENT DOCUMENTS

| | | |
|---|---|---|
| 5,157,269 | 10/1992 | Jordon et al. . |
| 5,165,046 | 11/1992 | Hesson . |
| 5,173,656 | 12/1992 | Seevinck et al. . |
| 5,206,544 | 4/1993 | Chen et al. . |
| 5,216,667 | 6/1993 | Chu et al. . |
| 5,218,248 | 6/1993 | Nagao . |
| 5,260,612 | 11/1993 | Lehmann et al. . |
| 5,283,761 | 2/1994 | Gillingham . |
| 5,313,118 | 5/1994 | Lundberg . |
| 5,329,190 | 7/1994 | Igarashi et al. . |
| 5,373,226 | 12/1994 | Kimura . |
| 5,382,841 | 1/1995 | Feldbaumer . |
| 5,399,960 | 3/1995 | Gross . |
| 5,414,583 | 5/1995 | Jordan . |
| 5,418,475 | 5/1995 | Otaka . |
| 5,422,608 | 6/1995 | Levesque . |
| 5,438,282 | 8/1995 | Kuo . |
| 5,440,182 | 8/1995 | Dobelaere . |
| 5,448,159 | 9/1995 | Kojima et al. . |
| 5,453,679 | 9/1995 | Rapp . |
| 5,463,331 | 10/1995 | Kuo . |
| 5,466,975 | 11/1995 | Wratten . |
| 5,479,636 | 12/1995 | Vanka et al. . |
| 5,481,207 | 1/1996 | Crafts . |
| 5,490,253 | 2/1996 | Laha et al. . |
| 5,585,796 | 12/1996 | Svensson et al. ............... 341/155 |

OTHER PUBLICATIONS

IBM TDB "Failure–Tolerant Self–Testing Driver/Receiver", vol. 30, No. 3, Aug. 1987, pp. 1215–1220.

1990 IEEE, Dept. of Electrical Engineering & Computer Science, MIT, "Simultaneous Bidirectional Signalling for IC Systems", Lam et al, pp. 430–433.

CURRENT SOURCE REFERENCED HIGH SPEED ANALOG TO DIGITIAL CONVERTER

CROSS REFERENCE TO RELATED APPLICATIONS

The present application is related to copending U.S. patent application having Ser. No. 08/770,602, filed on Dec. 19, 1996.

The identified application is assigned to the assignee of the present application.

FIELD OF THE INVENTION

The present invention relates in general to analog to digital signal conversion. More particularly, the invention is directed to a "flash" type analog current to digital voltage converter which uses current mirrors and a common reference signal.

BACKGROUND OF THE INVENTION

Integrated circuit technology is advancing at a phenomenal rate, not only in terms of shrinking device size but also in terms of increased chip area and faster clocking rates. Among the consequences of such technological developments are the uses of lower supply voltages and material increases in the number of input/output connections. The pinout limitations of integrated circuit chips suggests the use multilevel output signals. However, the low operating voltages and known noise levels precludes any routine use of multilevel coded voltage signals.

The use of current sources to simultaneously transmit high frequency signals over lines bi-directionally is described in U.S. Pat. No. 5,568,064, the subject matter of which is incorporated herein by reference. Refinements in current source drivers and reference generators associated therewith are respectively described in the U.S. patent applications having Ser. Nos. 08/703,318 and 08/703,317, both filed on Aug. 26, 1996, and incorporated herein by reference. Copending U.S. patent application Ser. No. 08/770,602, filed in Dec. 19, 1996, applies refinements described in such references to simultaneous cache section reading using multilevel signals. Though the references introduce the use of high speed multilevel current sources and sinks, they do not define an architecture by which communication can be established using multilevel current drivers and a hierarchically defined analog current to digital voltage converter.

SUMMARY OF THE INVENTION

The deficiencies in the prior art are solved through a current source referenced high speed analog to digital converter which is responsive to an analog input current and is comprised in one form of a means for generating an input signal proportioned to the analog input current as received in an integrated circuit chip, means for using the generated input signal in two or more parallel channels to compare in each channel the analog input current with multiples of a reference current, the parallel channels being individually associated with digital output bits of the integrated circuit chip, and means for feedback switching selected ones of the reference current multiples in a parallel channel responsive to a state of a digital output bit at a higher level of significance. Refinements include direct analog to binary coded decimal conversion and the use of current mirror connected field effect transistors to replicate input and reference signals.

In a particularized form of the invention, an analog signal in current form is converted into digital format using multiple quantization channels operated in parallel through current mirrors in conjunction with a feedback loop of selectively switched current sources. When a high order bit is detected in an associated channel, a current of that amount is subtracted from successively lower order bit channels through the use of switched current sources. The subtraction from the lower order bits occurs concurrently, so that the digital to analog conversion can be accomplished in a short time interval analogous to a "flash" converter.

In a further particularized form, the invention facilitates the direct analog current to digital binary coded decimal (BCD) conversion through the selective choice of switched subtraction current magnitudes in appropriate channels of the architecture. The use of higher order bits to turn off lower order bits is refined to generate an output conforming to the binary coded decimal protocol.

These and other features of the invention will be more clearly understood and appreciated upon considering the detailed embodiments described hereinafter.

DESCRIPTION OF THE PREFERRED EMBODIMENT

Figure 1:
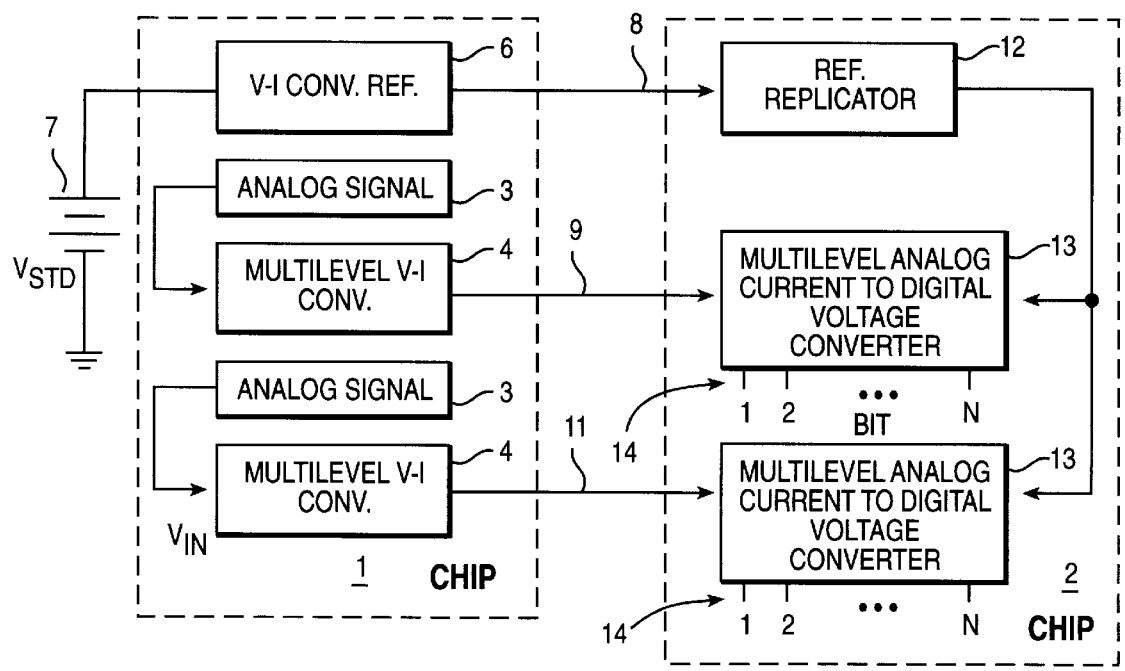
FIG. 1 is a schematic block diagram of functional elements configured to transmit multilevel signals between integrated circuit chips.

FIG. 1 schematically depicts by block diagram a system level application of the invention, whereby analog signals generated on integrated circuit chip 1 are transmitted to integrated circuit chip 2 using current sources which generate analog signals of different current levels. In the generalized form of FIG. 1, variable magnitude voltage signals are generated in blocks 3 and provided as voltages $V_{IN}$ to blocks 4 for voltage to multilevel current conversion. Integrated circuit chip 1 also includes a reference current generator, depicted in FIG. 1 as voltage to current converter reference 6. The output from reference 6 tracks accurate standard voltage generator 7 output $V_{STD}$.

The embodiment in FIG. 1 shows three lines, 8, 9, and 11, connecting integrated circuit chip 1 to integrated circuit chip 2. Line 8 conveys a reference current to reference replicator 12 in chip 2. The other two lines, 9 and 11, convey analog currents to multilevel analog current to digital voltage converters 13. The various current magnitudes transmitted over lines 9 and 11 represent data in analog form. Converters 13 change the analog current signals into digital bits of binary format, output as generally shown at 14.

The invention utilizes characteristics of integrated circuits to obtain the precision required to convert multilevel analog signals into digital format equivalents. In this regard, it is known that integrated circuit resistors formed on the same chip and in close proximity can be relatively accurately matched. Likewise, it is known that field effect transistor dimensions can be accurately controlled so as to allow current mirror replication of signals in precise increments as defined by transistor channel widths. Likewise, it is well recognized that characteristics of active devices on a common integrated circuit chip tend to track as to thermal variation, ensuring relative correspondence within the framework of each chip. Lastly, termination connected field effect transistors have been found to exhibit relatively consistent current to voltage conversion characteristics even between distinct integrated circuit chips. The benefits of the present invention are attributable to a selective utilization of these and other integrated circuit device characteristics to provide accurate multilevel analog current to digital voltage conversion.

Figure 2:
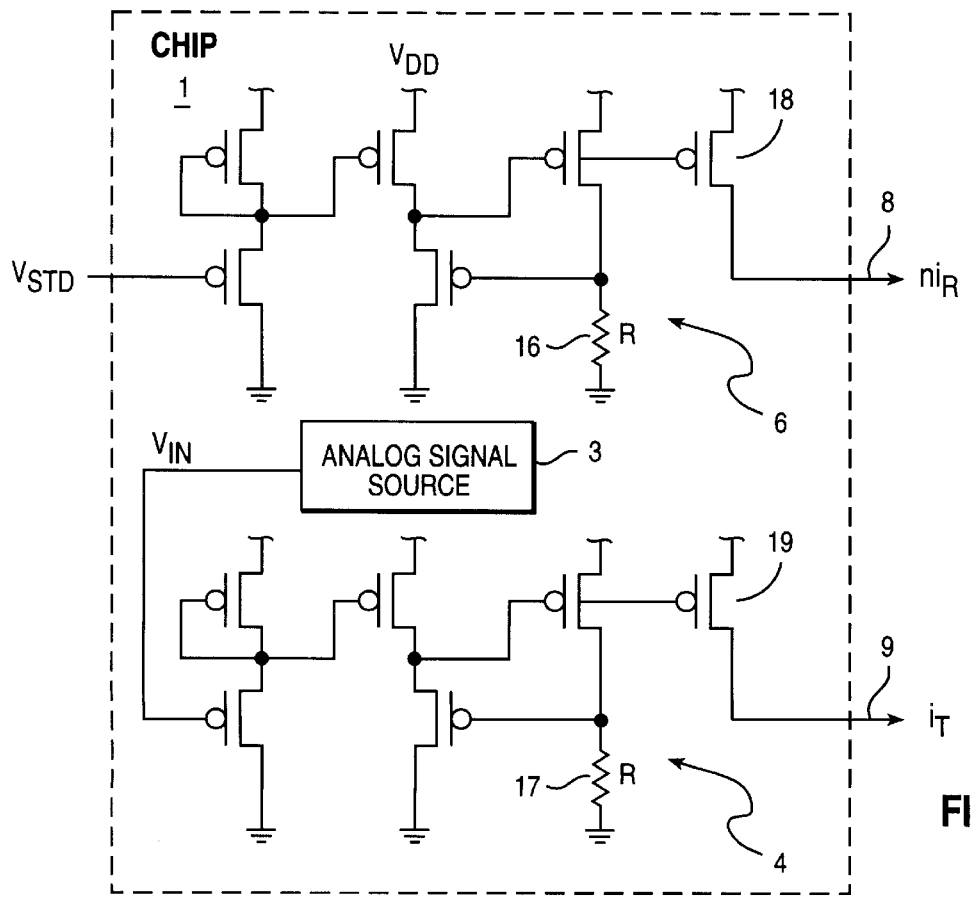
FIG. 2 is a schematic depicting circuitry for generating a reference current, and for generating a transmitted analog current corresponding to an analog input voltage.

FIG. 2 schematically depicts circuits suited to provide the functions of voltage to current converter reference 6 and multilevel voltage to current converter 4 as integrated on common chip 1. The integration ensures that resistor 16 in reference circuit 6 accurately matches resistor 17 in converter circuit 4. Thereby, the reference current $ni_R$ is accurately related to the transmission current $i_T$. Respective output transistors 18 and 19 in reference 6 and converter 4 operate as current sources so that reference signal line 8 has an accurately established reference current $ni_R$ and transmission line 9 has an accurately established transmission current $i_T$.

Figure 3:
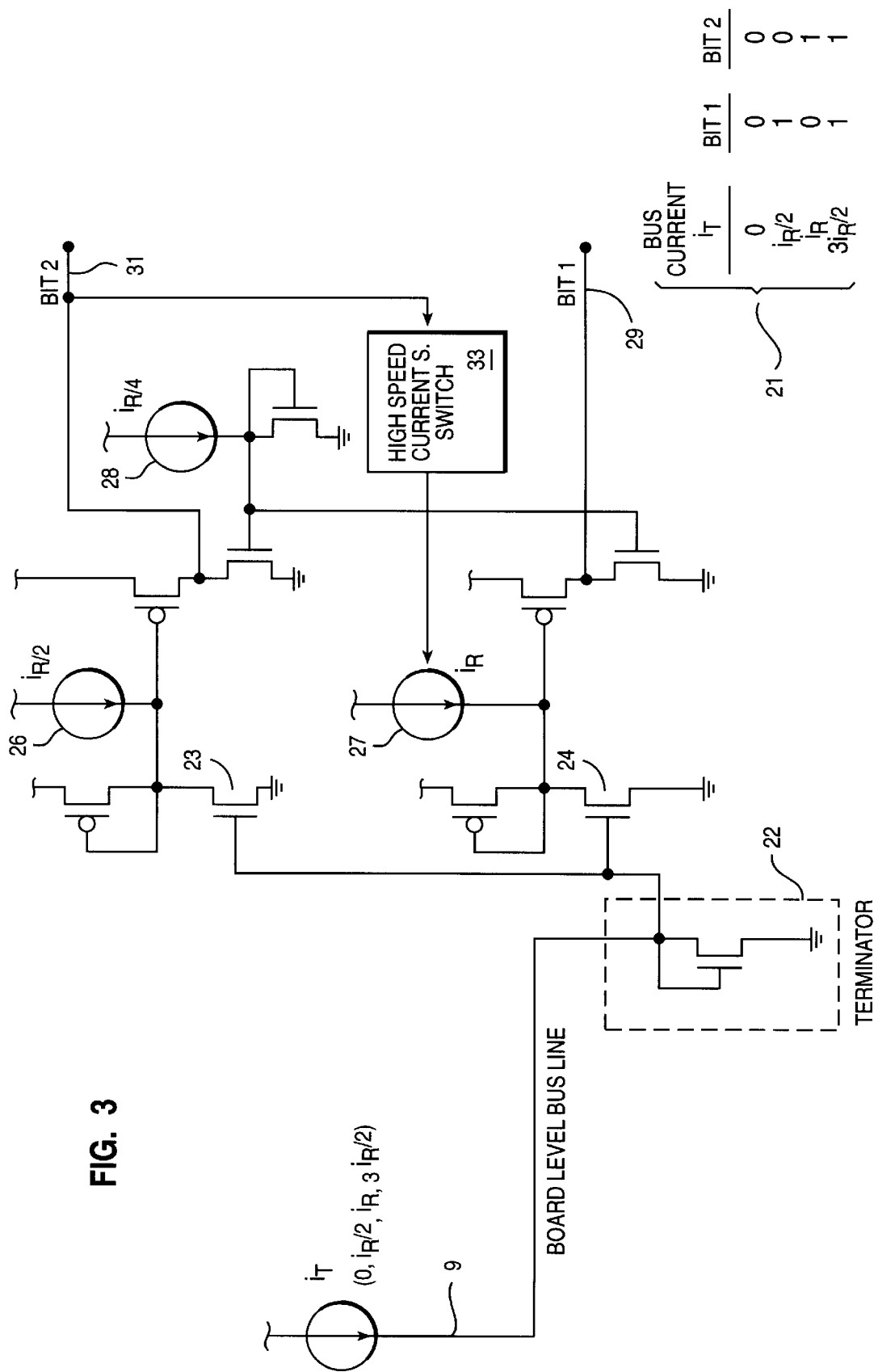
FIG. 3 is a schematic illustrating a circuit for converting analog input currents into two digital bits.

FIG. 3 schematically illustrates a particularized application of a multilevel analog current to digital voltage converter, such as 13 in FIG. 1. The application is analogous to that described in U.S. patent application Ser. No. 08/770,602, filed on Dec. 19, 1996, noted and incorporated by reference hereinbefore. The embodiment depicted in FIG. 3 involves a converter providing two digital bits in keeping with the conversion table at reference numeral 21 in FIG. 3. Bus line current $i_T$ received by converter 13 is in analog increments of 0, $i_R/2$, $i_R$, or $3i_R/2$. Current $i_T$ drives terminator 22, and in doing so provides a corresponding gate voltage to mirror transistors 23 and 24. Reference replicator 12 (FIG. 1) provides multiple current sources 26, 27, and 28 in respective current amounts $i_r/2$, $i_R$, and $i_R/4$ to define thresholds against which mirrored transistors 23 and 24 compare. The outputs are on bit lines 29 and 31 for bit 1 and bit 2, respectively.

Note that the signal on higher order bit line 31 enables current source 27, and as such shifts the comparison provided by mirrored transistor 24 in an amount $i_R$. This effect appears in the bit 1 waveform depicted by plot in FIG. 4. The plots of analog input levels and corresponding digital states of bits 1 and 2 are shown. The momentary voltage spike on bit line 1 associated with the delayed enablement of the current source 27 in FIG. 3 appears at 32. The importance of speed in switch 33 which drives current source 27 is apparent from the implications of spike 32 in FIG. 4.

Figure 4:
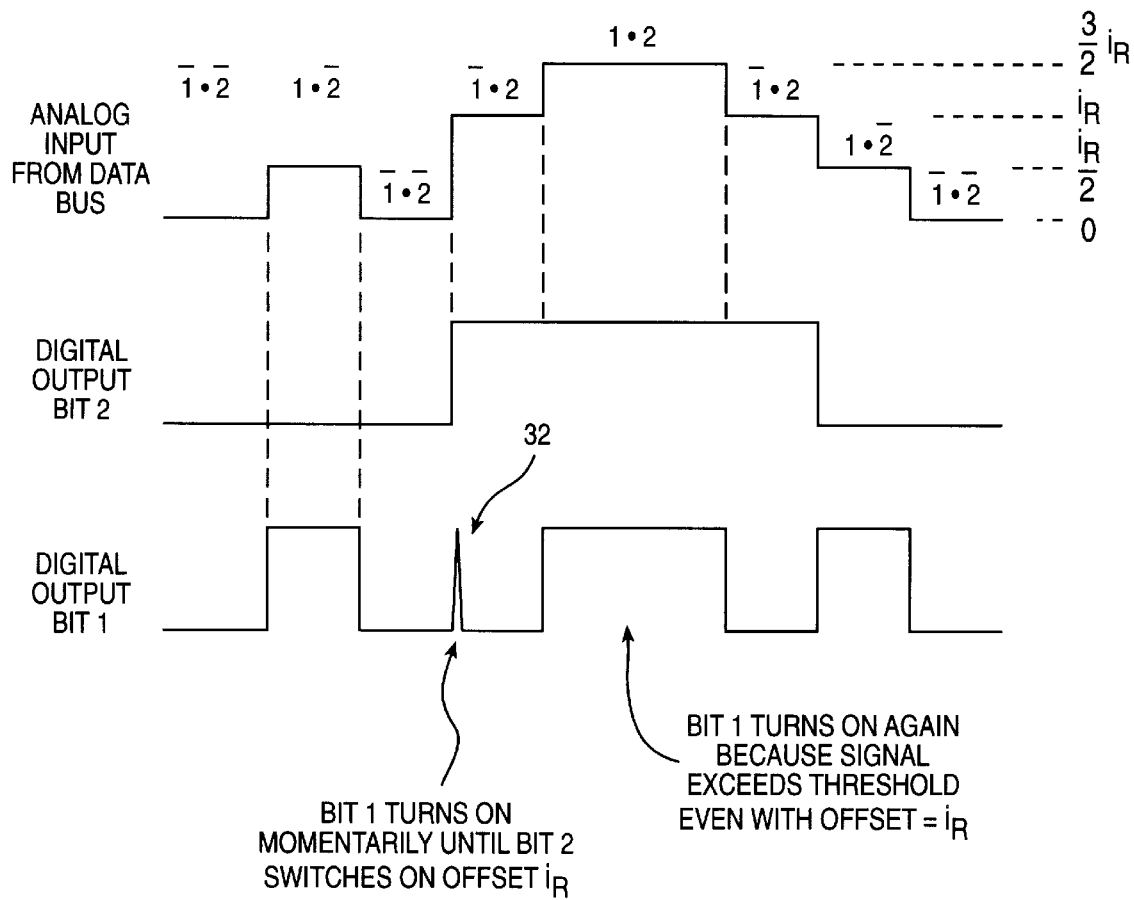
FIG. 4 is a schematic with waveform plots corresponding to conversions provided by the circuit in FIG. 3.
Figure 5:
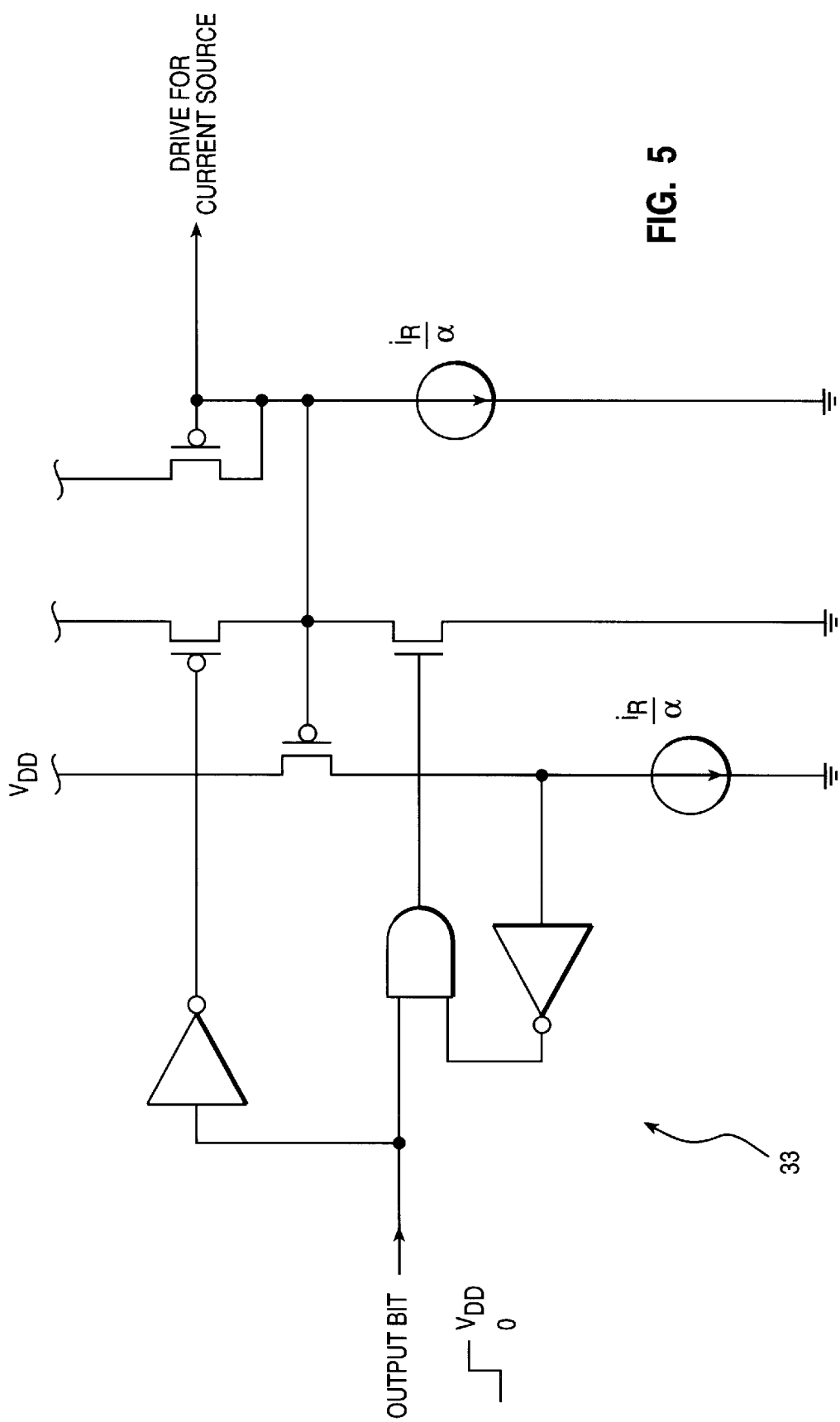
FIG. 5 is a schematic of a high speed current source switch circuit of the type used in FIG. 3.

A switch suitable to accomplish the high speed enablement of current source 27 in FIG. 3 is schematically depicted in FIG. 5. High speed current source switch 33 is configured to provide the rapid response to a bit output needed by current source 27 to minimize the duration of spike 32 (FIG. 4). The circuit is designed to quickly dissipate gate capacitance charge as might decrease the drive signal to current source 27 (FIG. 3). The current sources used in the circuit are scaled to minimize power dissipation.

Figure 6:
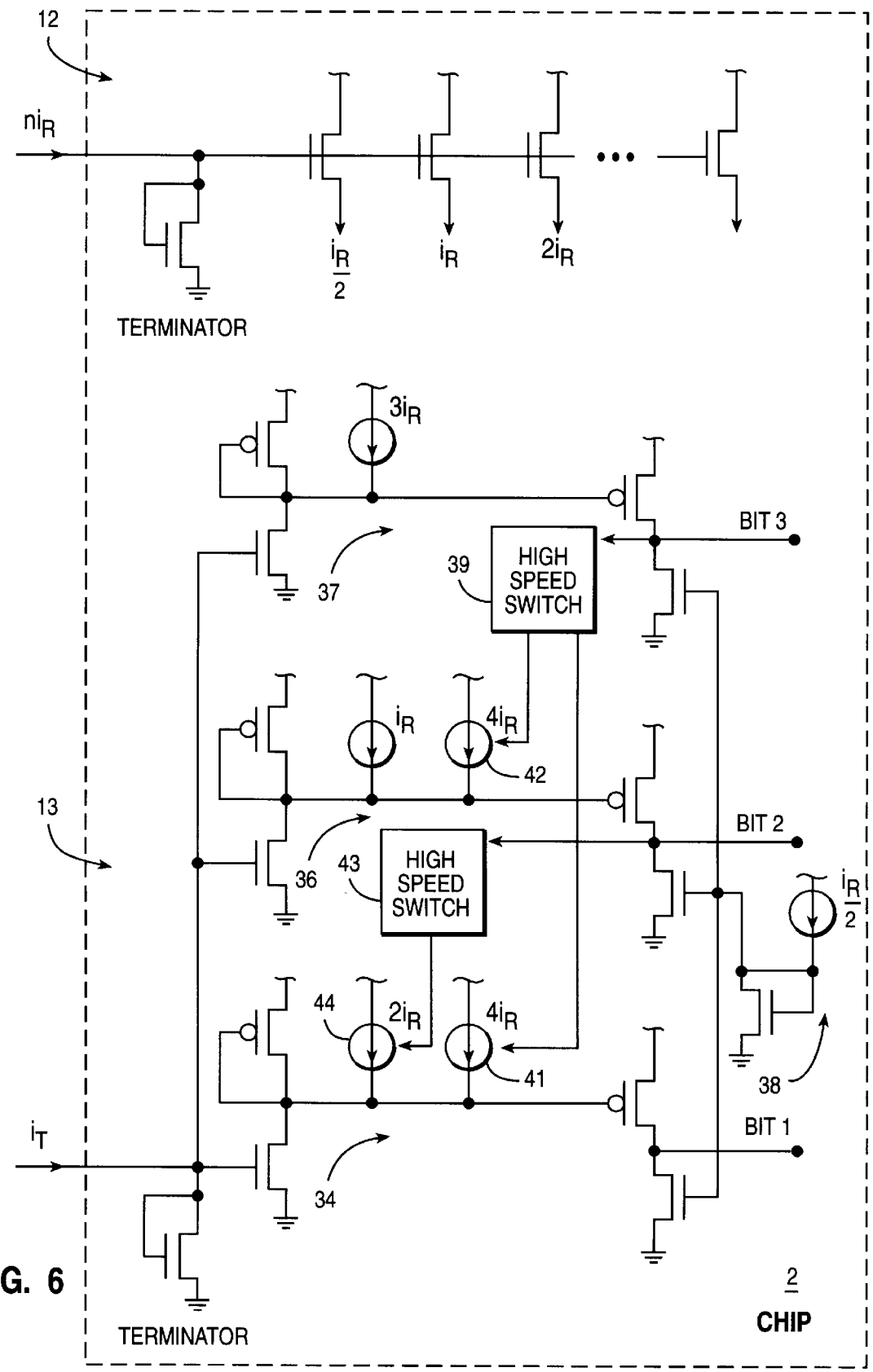
FIG. 6 is a schematic illustrating the architecture of an analog current to three bit digital voltage converter, including associated reference signals.

FIG. 6 schematically depicts another embodiment of multilevel analog current to digital voltage converter 13 as resides on chip 2 in FIG. 1. Also shown in FIG. 6 is an embodiment of reference replicator 12 (FIG. 1), commonly residing on chip 2. As embodied in FIG. 6, converter 13 receives a transmitted input current $i_T$ in analog format and converts the signal into a digital output composed of 3 bits. A comparison with the 2 bit analog to digital converter depicted in FIG. 3 shows a similar architecture, but now extended to include three parallel channels 34, 36, and 37 in direct correspondence to the bits of the digital output. Note in the architecture that the output of each higher order bit drives a switch enabling a current source in at least one lower order bit channel, the switched current source having a magnitude equivalent to the decimal value of the higher order bit less one.

The operation of the three bit architected analog to digital converter of FIG. 6 is analogous to that of the 2 bit implementation in FIG. 3. Namely, the transmitted input current $i_T$ is sunk in terminator 22, while the voltage generated thereby is used to drive current mirror transistors in converter channels 34, 36, and 37. The thresholds for enabling the bit corresponding to each channel are derived through comparisons with current sources and a fixed offset current source, generally at 38, common to all channels. Channels for bits having lower significance include current sources which are switched by bits of higher significance, preferably utilizing the high speed current source switch depicted in FIG. 5, or functionally equivalent versions thereof. For example, a high output on bit 3 enables high speed switch 39 and corresponding current sources 41 and 42 in respective channels 34 and 36. Similarly, a high level on bit 2 enables high speed switch 43 and corresponding current source 44, the current source residing in channel 34.

One feature of the architecture which makes it particularly appealing to perform analog to digital conversion derives from the fact that feedback switching of lower order bit channel currents is accomplished simultaneously. This simultaneity minimizes the delay associated with conversion by ensuring that the transient interval, such as at 32 in FIG. 4, is completely eliminated by the end of a single switched period. This avoids ripple type delays through transistor stages and provides the converter with features generally characterizing "flash" converters.

The reference currents, various multiples of $i_R$ used in converter 13, are readily derived using reference replicator 12, as shown in FIG. 6. The reference current $ni_R$ received into integrated circuit 2 is sunk in a terminator functionally corresponding to that used to sink current $i_T$ in converter 13. The relative matching of the termination device characteristics is attributable to their residing on a common integrated circuit chip. Reference replicator 12 then employs conventional current mirror techniques to generate a multiplicity of current source signals consistent with those needed by converter 13 through the appropriate dimensioning of field effect transistor channels.

Figure 7:
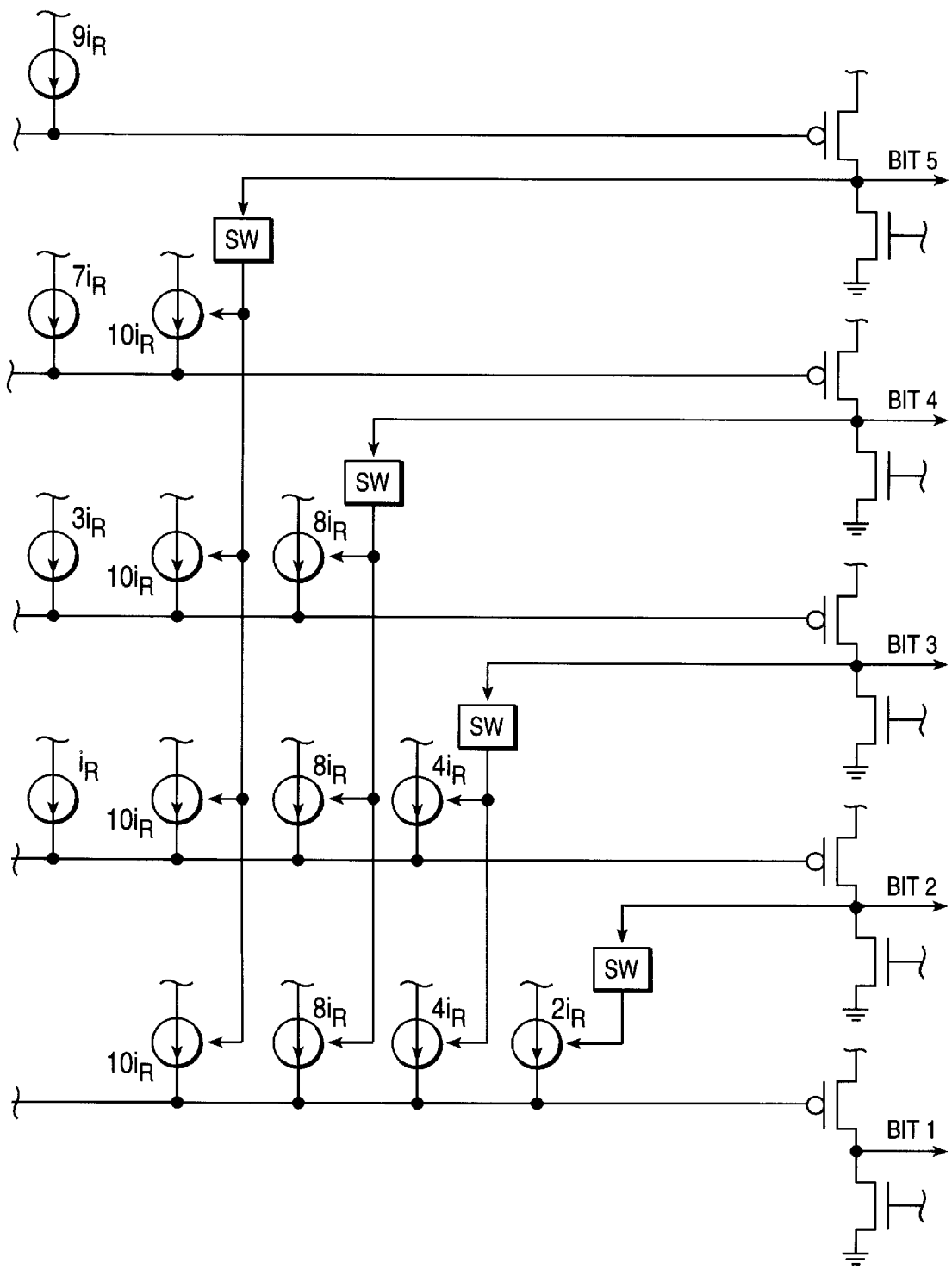
FIG. 7 is a schematic diagram of the architecture for a multiple bit analog current to binary coded decimal voltage converter, extending the basic architecture in FIG. 6 to 5 bit BCD.

FIG. 7 schematically depicts the architecture of a converter refined to the directly generate binary coded decimal equivalence of analog input currents. Note that the current sources connected to the channels of the successive bits are switched not only in increments of 2, 4, and 8, but also upon reaching the decimal equivalent 10. The effect of this refinement is to provide at the output digital data in direct binary coded decimal format.

Table A below sets forth the BCD output by bit when using the binary coded decimal architecture. The fifth bit is weighted by 10 instead of 16 within each sequence of switched current sources.

TABLE A

| Binary | BCD |
|--------|-----|
| 128 | 80 |
| 64 | 40 |
| 32 | 20 |
| 16 | 10 |
| 8 | 8 |
| 4 | 4 |
| 2 | 2 |
| 1 | 1 |

The ability to weight individual bits as an aspect of feedback switching currents allows conversion into numbering systems having other indices if so desired.

Though the features of the invention have been described in the context of communicating between separate integrated circuit chips, the invention is fully applicable to multilevel current communication within the confines of a single integrated circuit chip.

It will be understood by those skilled in the art that the embodiment set forth hereinbefore merely exemplary of the numerous arrangements by which the invention may be practiced, and as such may be replaced by equivalents without departing from the invention which will not be defined by appended claims.

We claim:

1. Analog to digital converter responsive to an input current, comprising:
   means for generating an input signal proportioned to the analog input current as received in an integrated circuit chip;
   means for using the generated input signal in two or more parallel channels to concurrently compare in each of the parallel channels the analog input current with multiples of a reference current, the parallel channels being individually associated with digital output bits of the integrated circuit chip; and
   means for feedback switching, during the concurrent compare selected ones of the reference current multiples in a parallel channel responsive to a state of a digital output bit at a higher level of significance.

2. The apparatus recited in claim 1, wherein the multiples of the reference current used in the two or more channels define an analog to binary coded decimal (BCD) conversion sequence.

3. The apparatus recited in claim 2, wherein the means for using the generated input signal comprises current mirror connected field effect transistors.

4. The apparatus recited in claim 3, further comprising:
   means for communicating the magnitude of the reference current between an origin of the input current and the integrated circuit chip.

5. The apparatus recited in claim 4, further comprising:
   means for generating a reference current at the origin of the input current; and
   means for generating scaled multiples of the reference current on the integrated circuit chip.

6. The apparatus recited in claim 5, wherein the means for feedback switching is a high speed current source switch operable to selectively enable the multiples of the reference current within a clock cycle.

7. The apparatus recited in claim 1, wherein the means for using the generated input signal comprises current mirror connected field effect transistors.

8. The apparatus recited in claim 7, further comprising:
   means for communicating the magnitude of the reference current between an origin of the input current and the integrated circuit chip.

9. The apparatus recited in claim 8, further comprising:
   means for generating a reference current at the origin of the input current; and
   means for generating scaled multiples of the reference current on the integrated circuit chip.

10. The apparatus recited in claim 9, wherein the means for feedback switching is a high speed current source switch operable to selectively enable the multiples of the reference current within a clock cycle.

* * * * *